(12) United States Patent
Bahnmüller et al.

(10) Patent No.: US 8,101,097 B2
(45) Date of Patent: Jan. 24, 2012

(54) PRINTABLE COMPOSITIONS CONTAINING SILVER NANOPARTICLES, PROCESSES FOR PRODUCING ELECTRICALLY CONDUCTIVE COATINGS USING THE SAME, AND COATINGS PREPARED THEREBY

(75) Inventors: Stefan Bahnmüller, Singapur (SG); Stefanie Eiden, Leverkusen (DE); Stephan Michael Meier, Grevenbroich (DE); Dirk Storch, Köln (DE); Bernard Dunkel, Leverkusen (DE)

(73) Assignee: Bayer MaterialScience AG, Leverkusen (DE)

( * ) Notice: Subject to any disclaimer, the term of this patent is extended or adjusted under 35 U.S.C. 154(b) by 314 days.

(21) Appl. No.: 12/466,636

(22) Filed: May 15, 2009

(65) Prior Publication Data

US 2010/0040846 A1     Feb. 18, 2010

(30) Foreign Application Priority Data

May 16, 2008 (DE) .......................... 10 2008 023 882

(51) Int. Cl.
- *H01B 1/02* (2006.01)
- *C08G 75/00* (2006.01)
- *C08G 73/00* (2006.01)
- *C08G 73/06* (2006.01)
- *B22F 7/00* (2006.01)

(52) U.S. Cl. ........ 252/514; 528/377; 528/422; 528/423; 106/1.18

(58) Field of Classification Search ................... 252/514; 528/377, 422, 423; 106/1.18
See application file for complete search history.

(56) References Cited

U.S. PATENT DOCUMENTS

| | | | |
|---|---|---|---|
| 5,882,722 A | 3/1999 | Kydd | |
| 6,036,889 A | 3/2000 | Kydd | |
| 7,560,052 B2 * | 7/2009 | Enciu et al. | 252/514 |
| 2005/0078158 A1 | 4/2005 | Magdassi et al. | |
| 2008/0113195 A1 | 5/2008 | Boll et al. | |
| 2008/0169122 A1 | 7/2008 | Shiraishi et al. | |

FOREIGN PATENT DOCUMENTS

| | | |
|---|---|---|
| CA | 2649005 A1 | 10/2007 |
| DE | 102006017696 A1 | 10/2007 |
| DE | 102007037079 A1 | 4/2008 |
| EP | 1586604 A1 | 10/2005 |
| EP | 1860163 A1 | 11/2007 |
| WO | WO-03/038002 A1 | 5/2003 |
| WO | WO-2004067647 A2 | 8/2004 |
| WO | WO-2006076603 A2 | 7/2006 |
| WO | WO-2008/031015 A1 | 3/2008 |

OTHER PUBLICATIONS

Hendriks, at al., "'Invisible' Silver Tracks Produced by Combining Hot-Embossing and Inkjet Printing," *Adv. Fund. Mater.*, (2008), vol. 18, pp. 1031-1038.

* cited by examiner

*Primary Examiner* — Mark Kopec
*Assistant Examiner* — Jaison Thomas
(74) *Attorney, Agent, or Firm* — Connolly Bove Lodge & Hutz LLP

(57) ABSTRACT

Printable compositions comprising: (a) 5 to 40 parts by weight of silver nanoparticles having a maximum effective diameter of 150 nm, as determined by laser correlation spectroscopy; (b) 50 to 99.5 parts by weight of water; (c) 0.01 to 15 parts by weight of a dispersing agent; (d) 0.5 to 5 parts by weight of a film former; and (g) 30 to 70 parts by weight of metal particles having a maximum effective diameter of 10 μm, as determined by laser correlation spectroscopy; wherein the printable composition has a viscosity of at least 1 Pa·s; processes for producing electrically conductive coatings using such compositions and electrically conductive coatings prepared thereby.

19 Claims, No Drawings

PRINTABLE COMPOSITIONS CONTAINING SILVER NANOPARTICLES, PROCESSES FOR PRODUCING ELECTRICALLY CONDUCTIVE COATINGS USING THE SAME, AND COATINGS PREPARED THEREBY

BACKGROUND OF THE INVENTION

There is a demand in principle for electrically conductive structures on surfaces of objects with poor surface conductivity. With regard to the conductivity, for example, uses in the integration of electronic circuits into an electronic component by impressing conductive material on the surface of the component are desirable. Costly composite problems of components with separate circuits could thereby be minimized. In particular, the printing of surfaces of flexible materials with electrical strip conductors is particularly interesting. The freedom of design of the whole component with a flexible content should no longer be influenced by the circuit provided.

The application of copper strip conductors is known. These, however, are applicable to surfaces only with costly deposition and etching processes. Electrically conductive pastes (e.g., conductive silver) which can be subsequently applied to surfaces and are used for contacting, are a further development.

There is particular interest in printing polymer materials. During the printing process by which the surface is made conductive, the surface of the substrate should not be heated above the softening point (e.g., glass transition temperature of a polymer surface) of the surface material. In addition, no solvent that dissolves or partially dissolves the surface may be used.

Known processes with which structures can be applied to surfaces inexpensively and with good throughput, are screen printing or offset printing processes. These two processes, however, place further requirements on the printing substance used. Thus it is known to the person skilled in the art that inks or dyes that should be used with these printing processes place minimum requirements on the viscosity of the printing ink. The viscosity must be in the range above 1 Pa·s so that good printing results can be achieved.

U.S. Pat. Nos. 5,882,722 and 6,036,889, the entire contents of each of which are hereby incorporated herein by reference, describe conductive formulations which contain metal particles, a precursor and an organic solvent and which only form conductive structures at a sintering temperature from 200° C. upwards. These known formulations have a viscosity of approximately 10 Pa·s. The formulation can in fact be used for the printing technologies described (screen printing, offset printing), but because of the high sintering temperature required, use for application to surfaces of polymers is restricted.

International Patent Pub. No. WO2003/038002 and U.S. Pat. App. Pub. No. 2005/0078158, the entire contents of each of which are hereby incorporated herein by reference, disclose formulations with silver nanoparticles which are stabilized inter alia with sodium cellulose methyl carboxylic acid. These documents in fact describe the need for post-treatment, e.g. by heat, or flocculants, but not the processing temperature or the conductivity of the microstructures obtained from the formulation. Furthermore, the accurate distribution of the nanoparticles used and obtained is not disclosed, although the size range is less than 100 nm. The content of silver particles of the disclosed formulations is not more than 1.2 wt. %. The viscosity of the printing formulation typically necessary for the inkjet process provided is approximately 10 mPa·s. The formulation is therefore not really feasible for screen or offset printing.

European Pat. Pub. No. EP 1586604, the entire contents of which are hereby incorporated herein by reference, discloses a silver paste that is composed of an epoxy resin, silver flakes and silver nanoparticles. This paste forms a conductive film after printing on or application to the surface of a base material and subsequent heat treatment. Resistances of less than $5\times10^5$ ohm/cm are achieved at sintering temperatures above 200° C. This high sintering temperature greatly restricts the selection of the printable polymer substrates.

International Patent Pub. No. WO 2008/031015, the entire contents of which are hereby incorporated herein by reference, discloses an aqueous formulation which also contains silver flakes. Conductivities of 0.022 ohm/square can be achieved with this formulation at 120° C.

HARIMA offers the product line "NP Series Nano-Paste" which is a nanoparticles-based silver conductive ink with low viscosity. HARIMA, however, gives sintering temperatures of 210-230° C.

BRIEF SUMMARY OF THE INVENTION

The invention relates, in general, to inks suitable for the production of electrically conductive printed images, which are based on nanoscale silver particles and at least one, preferably polymeric, dispersing agent in an aqueous formulation and a process for the manufacture thereof. Various embodiments of the present invention can provide electrically conductive structures on surfaces by applying such formulations via screen, flexographic, engraved or offset printing processes. This can be achieved by an aqueous silver-containing formulation which, in addition to silver, contains at least one polymer, by applying to a surface by screen, flexographic, engraved or offset printing and ultimate thermal treatment of the printed surface so that a conductivity or reflective surface is produced.

Prior to the present invention, the provision of conductive formulations which, using elemental silver, make it possible to produce conductive structures on, in particular, thermally labile surfaces using offset or screen printing technology had been unknown. Low temperatures in the context of the present invention include, e.g., temperatures which are below the glass transition temperature of the polymer surface (e.g., PVC~80° C.).

The various embodiments of the present invention provide silver-containing formulations which can be applied to a surface by screen, flexographic, engraved or offset printing and can be sintered to the surface by thermal treatment at temperatures of $\leqq 140°$ C., possibly less than 100° C., to produce conductive structures.

The invention provides a printable composition for the production of electrically conductive coatings based on silver particles dispersed in water, comprising at least a) 5 to 40 parts by weight silver metal particles with an effective diameter of maximum 150 nm, preferably maximum 100 nm, particularly preferably 20 to 80 nm, especially preferably 40 to 80 nm, determined by laser correlation spectroscopy, wherein the silver particles have in particular a bimodal size distribution b) 50 to 99.5 parts by weight water and optionally up to 30 parts by weight solvent, c) 0.01 to 15 parts by weight at least of an in particular polymer dispersing agent, e) 0 to 5 parts by weight additives, preferably 0.5 to 5 parts by weight, particularly preferably 1 to 4 parts by weight additives f) 0 to 5 parts by weight conductive, optionally water-soluble polymers, preferably 0.5 to 5 parts by weight, particularly preferably 1 to 4 parts by weight conductive polymers characterised in that the formulation has d) 0.5 to 5 parts by weight, preferably 1 to 4 parts by weight, thickener, g) and 30 to 70 parts by weight metal particles with an effective diameter of maximum 10 μm, in particular 500 nm-10 μm, preferably silver particles or copper particles which are sheathed in silver, and a viscosity of at least 1 Pa·s.

The sum of the parts by weight of the components of the formulation is in particular 100 parts by weight.

One embodiment of the present invention includes printable compositions comprising: (a) 5 to 40 parts by weight of silver nanoparticles having a maximum effective diameter of 150 nm, as determined by laser correlation spectroscopy; (b) 50 to 99.5 parts by weight of water; (c) 0.01 to 15 parts by weight of a dispersing agent; (d) 0.5 to 5 parts by weight of a film former; and (g) 30 to 70 parts by weight of metal particles having a maximum effective diameter of 10 μm, as determined by laser correlation spectroscopy; wherein the printable composition has a viscosity of at least 1 Pa·s. The effective diameter is the average diameter as determined by laser correlation spectroscopy (suitable measuring instrument e.g. Brookhaven BIC-90 Plus).

Another embodiment of the present invention includes processes comprising: (i) providing a substrate; (ii) printing a composition according to any of the various embodiments of the invention on the substrate via one or more of screen printing, flexographic printing, engraved printing, and offset printing; and (iii) heat-treating the printed composition to form a strip conductor.

Yet another embodiment of the present invention includes substrates comprising an electrically conductive coating prepared by any of the processes according to the invention.

The determination of size by laser correlation spectroscopy is known from the literature, and is described, for example, in T. Allen, Particle Size Measurements, vol. 1, Kluver Academic Publishers, 1999, the entire contents of which are incorporated herein by reference.

DETAILED DESCRIPTION OF THE INVENTION

As used herein, the singular terms "a" and "the" are synonymous and used interchangeably with "one or more" and "at least one," unless the language and/or context clearly indicates otherwise. Accordingly, for example, reference to "a dispersing agent" herein or in the appended claims can refer to a single dispersing agent or more than one dispersing agent. Additionally, all numerical values, unless otherwise specifically noted, are understood to be modified by the word "about."

Dispersing agents suitable for use in the various embodiments of the present invention preferably comprise at least one agent selected from the group: alkoxylates, alkylol amides, esters, amine oxides, alkyl polyglucosides, alkyl phenols, aryl alkyl phenols, water-soluble homopolymers, water-soluble statistical copolymers, water-soluble block copolymers, water-soluble graft polymers, in particular polyvinyl alcohols, copolymers of polyvinyl alcohols and polyvinyl acetates, polyvinylpyrrolidone, cellulose, starch, gelatine, gelatine derivatives, amino acid polymers, polylysine, polyaspartic acid, polyacrylates, polyethylene sulfonates, polystyrene sulfonates, polymethacrylates, condensation products of aromatic sulfonic acids with formaldehyde, naphthalene sulfonates, lignin sulfonates, copolymers of acrylic monomers, polyethylene imines, polyvinyl amines, polyallyl amines, poly(2-vinylpyridines), block copolyethers, block copolyethers with polystyrene blocks and/or polydiallyl dimethyl ammonium chloride.

The dispersing agent is particularly preferably selected from the series: polyvinylpyrrolidone, block copolyethers and block copolyethers with polystyrene blocks, Polyvinylpyrrolidone with a molar mass of approximately 8000 amu to 400,000 amu (e.g. PVP K15, a polyvinylpyrrolidone with a molar mass of 10,000 amu from Fluka or PVP K90 (molar mass of approximately 360,000 amu) from Fluka) are especially preferably used and particularly preferably also block copolyethers with polystyrene blocks, with 62 wt. % $C_2$ polyether, 23 wt. % $C_3$ polyether and 15 wt. % polystyrene, based on the dried dispersing agent, with a ratio of block lengths $C_2$ polyether to $C_3$ polyether of 7:2 units (e.g. Disperbyk 190 from BYK-Chemie, Wesel).

A solution (b) selected from the series: $C_1$ to $C_5$ alcohol, in particular $C_1$ to $C_3$ alcohol, ethers, in particular dioxalane, glycols, in particular glycerol, ketones, in particular acetone, is particularly preferably used.

Suitable film formers (d) can be preferably selected from the series: polydimethyl siloxane, polyacrylate, ammonium salts of polyacrylates, siloxanes, wax combinations, copolymers with pigment-active groups, low-molecular polymers, modified cellulose, in particular hydroxyethyl cellulose or methyl cellulose, carbon nanotubes and polyvinyl alcohol, preferably hydroxyethyl cellulose, methyl cellulose and carbon nanotubes. Other preferred film formers (d) are selected from the group of dispersing agents named above, here particularly preferably e.g. the dispersing agent BYK 356 from BYK-Chemie, Wesel, a polyacrylate and BYK 154 from the same company, the ammonium salt of an acrylate copolymer. The film formers (d) can also be used in any combinations; it is preferable to use a combination of hydroxyethyl cellulose and/or methyl cellulose with carbon nanotubes, Suitable additives (e) can be preferably selected from the series: pigments, defoamers, light stabilisers, optical brighteners, corrosion inhibitors, antioxidants, algicides, plasticisers, thickeners, surface-active substances. The additive is particularly preferably a reducing agent, such as e.g. formaldehyde, glycerol, ascorbic acid etc. Formaldehyde is especially preferably used as additive.

Suitable conductive polymers (f) can be preferably selected from the series: polypyrrol, polyaniline, polythiophene, polyphenylenevinylene, polyparaphenylene, polyethylenedioxythiophene, polyfluorene, polyacetylene, particularly preferably polyethylenedioxythiophene in combination with polystyrene sulfonic acid. A conductive salt is preferably an "ionic liquid", in particular salts of the type: tetraalkyl ammonium, pyridinium, imidazolium, tetraalkyl phosphonium with fluorinated anions.

A particularly preferred formulation is characterised in that the silver particles (a) have an effective particle diameter of 10 to 150 nm, preferably 20 to 80 nm, particularly preferably 40 to 80 nm, determined by laser correlation spectroscopy.

The silver particles (a) are preferably contained in the formulation at a level of 10 to 35 parts by weight, particularly preferably 15 to 30 parts by weight. The content of dispersing agent (c) is preferably 0.1 to 15 parts by weight, particularly preferably 5 to 10 parts by weight.

It can also be advantageous if the particles used are able in the final formulation to form tight packings which, even at low concentrations and processing temperatures, lead to the desired conductivity of the printed structure. The requirement of the low concentration thereby has purely economic backgrounds. The lower the level of particles can be maintained with the same or similar conductivity, the lower are the material costs of the resulting formulation. A replacement of as large contents by weight of particles as possible by other materials is therefore desirable.

The invention furthermore provides the use of the composition according to the invention for the production of electrically conductive coatings, in particular strip conductors.

The invention also provides a process for the production of strip conductors which is characterised in that the new formulation is printed on a substrate surface using a screen printing, flexographic printing, engraved printing or offset printing method and heat-treated in particular at a temperature of maximum 140° C., preferably maximum 100° C., to remove water residues and optionally solvents and optionally to sinter silver particles present.

A particularly preferable formulation is characterised in that it uses silver particles of different size. It was surprisingly found that a distribution of this type is advantageous for a formation of conductive structures even at lower contents of the silver nanoparticles. It must be assumed that this is caused by filling the intermeshing volumes produced between the larger particles with smaller ones. This produces larger, continuous contact areas in the thermal post-treatment of the ink. The resulting formulation consequently achieves, at lower mass content, the same conductivity of an ink with approximately monodisperse distribution at approximately the same effective diameter, or a higher one at the same content by mass and the same effective diameter The invention furthermore provides a substrate, in particular transparent plastic substrate having an electrically conductive coating obtainable from a composition according to the invention. A substrate in which the electrically conductive coating comprises strip conductors with a conductivity of minimum $5 \cdot 10^5$ S/m is preferred.

The above-described requirements are furthermore fulfilled by a formulation which contains silver nanoparticles, silver particles, solvents, film formers, dispersing agents and additives. It preferably contains small silver nanoparticles which—substantially—contain an effective diameter of 20 to 80 nm, preferably 40 to 80 nm with a bimodal distribution in a concentration of 5 to 40 wt. %, preferably 15 to 30 wt. %. The formulation can be applied for example to polycarbonate, then dried and heat-treated for several minutes at at least 80° C. Highly adhesive, electronically conductive structures or, with a surface application, optically reflecting layers, both with high adhesion to polycarbonate, are then obtained.

The silver sols preferably used in the formulation are produced from $Ag_2O$ by reduction with a reducing agent such as aqueous formaldehyde solution (FA) after previous addition of a dispersing agent. For this, the $Ag_2O$ sols are produced batchwise for example by rapid mixing of silver nitrate solution with NaOH by rapid stirring or by using a micromixer according to U.S. Patent Application Publication No. 2009/0263496 in a continuous process. The $Ag_2O$ nanoparticles are then reduced with FA in excess in a batch process and ultimately purified by centrifuging or by membrane filtration, preferably by membrane filtration. This mode of production is particularly advantageous because the quantity of organic auxiliary substances bonded to the surface of the nanoparticles can thereby be kept low and furthermore a bimodal size distribution can be obtained. In particular, no pre-treatment steps, such as e.g. a prereduction in the presence of polymers, or other post-treatment steps apart from energy input, such as e.g. activation of a precursor system, or flocculation, are required.

The invention will now be described in further detail with reference to the following non-limiting examples.

Examples

Example 1

Production of Nanosilver

A 0.054 molar silver nitrate solution was added to a mixture of a 0.054 molar caustic soda and the dispersing agent Disperbyk 190 (manufacturer: BYK Chemie) (1 g/l) in a ratio by volume of 1:1 and stirred for 10 minutes. An aqueous 4.6 molar aqueous formaldehyde solution was added to this reaction mixture with stirring so that the ratio of $Ag^+$ to reducing agent is 1:10. This mixture was heated to 60° C., maintained at this temperature for 30 minutes and then cooled. The particles were separated from the unreacted educts in a first step by means of diafiltration and the sol was then concentrated, for which a membrane with 30,000 Dalton was used. A colloid-stable sol with a solid content of 20 wt. % (silver particles and dispersing agent) was produced. The content of Disperbyk 190, according to elementary analysis after the membrane filtration, was 6 wt. % based on the silver content. An examination by means of laser correlation spectroscopy (Brookhaven BIC-90 Plus) gave an effective particle diameter of 78 nm.

Example 2

1.5 g PVP K40 (SIGMA-ALDRICH) and 1.5 Disperbyk 190 (Altana, Byk-Additives) are dissolved in 15 ml 20% nanosilver sol from example 1. 30 g silver powder (Metalor K-1332 P) are then introduced into the mixture by means of ultrasonic fingers (G. Heinemann, Ultraschal und Labortechnik) at an amplitude of 30% of the maximum performance. The paste is then applied to a polycarbonate film (Makrolon®, Bayer MaterialScience AG) by means of screen printing and heat-treated at 130° C. A specific conductivity of $2 \times 10^6$ S/m is achieved.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A printable composition comprising: (a) 5 to 40 parts by weight of silver nanoparticles having a maximum effective diameter of 150 nm and a bimodal size distribution, as determined by laser correlation spectroscopy; (b) 50 to 99.5 parts by weight of water; (c) 0.01 to 15 parts by weight of a dispersing agent; (d) 0.5 to 5 parts by weight of a film former; and (g) 30 to 70 parts by weight of metal particles having a maximum effective diameter of 10 µm, as determined by laser correlation spectroscopy; wherein the printable composition has a viscosity of at least 1 Pa·s.

2. The printable composition according to claim 1, further comprising (e) an additive present in an amount of up to 5 parts by weight.

3. The printable composition according to claim 1, further comprising (f) a conductive polymer present in an amount of up to 5 parts by weight.

4. The printable composition according to claim 3, wherein the conductive polymer comprises one or more selected from the group consisting of polypyrrols, polyanilines, polythiophenes, polyphenylene vinylenes, polyparaphenylenes, polyethylene dioxythiophenes, polyfluorenes, polyacetylenes, and mixtures thereof.

5. The printable composition according to claim 3, wherein the conductive polymer comprises polyethylene dioxythiophene and polystyrene sulfonic acid.

6. The printable composition according to claim 1, wherein the dispersing agent comprises a polymer dispersing agent.

7. The printable composition according to claim 6, wherein the polymer dispersing agent comprises one or more selected from the group consisting of block copolyethers, block copolyethers having polystyrene blocks, and mixtures thereof.

8. The printable composition according to claim 1, wherein the metal particles comprise one or more selected from the group consisting of silver particles, copper particles sheathed in silver, or combinations thereof.

9. The printable composition according to claim 1, wherein the metal particles have an effective diameter of 500 nm to 10 μm.

10. The printable composition according to claim 1, further comprising a solvent present in an amount of up to 30 parts by weight.

11. The printable composition according to claim 10, wherein the solvent comprises one or more compounds selected from the group consisting of $C_{1-5}$ alcohols, ethers, glycols, ketones, and mixtures thereof.

12. The printable composition according to claim 1, wherein the film former comprises one or more selected from the group consisting of polyacrylates, ammonium salts of polyacrylates, siloxanes, polyethylene glycols, waxes, modified celluloses, carbon nanotubes, polyvinyl alcohols, and combinations thereof.

13. The printable composition according to claim 1, wherein the film former comprises a mixture of a modified cellulose and carbon nanotubes.

14. The printable composition according to claim 1, wherein the silver nanoparticles are present in an amount of 10 to 35 parts by weight and the dispersing agent is present in an amount of 0.1 to 15 parts by weight.

15. The printable composition according to claim 1, wherein the silver nanoparticles are present in an amount of 15 to 30 parts by weight and the dispersing agent is present in an amount of 5 to 10 parts by weight.

16. A process comprising: (i) providing a substrate; (ii) printing a composition according to claim 1 on the substrate via one or more of screen printing, flexographic printing, engraved printing, and offset printing; and (iii) heat-treating the printed composition to form a strip conductor.

17. The process according to claim 16, wherein the heat-treating is carried out at a maximum temperature of 140° C.

18. A substrate comprising an electrically conductive coating prepared by the process according to claim 16.

19. The substrate according to claim 18, wherein the electrically conductive coating has a conductivity of at least $5 \cdot 10^4$ S/m.

* * * * *